United States Patent [19]

Upadhya

[11] Patent Number: 5,705,283
[45] Date of Patent: Jan. 6, 1998

[54] TUNGSTEN-COPPER COMPOSITE MATERIAL WITH RHENIUM PROTECTIVE LAYER, AND ITS PREPARATION

[75] Inventor: Kamleshwar Upadhya, Quartz Hills, Calif.

[73] Assignee: Hughes Electronics, Los Angeles, Calif.

[21] Appl. No.: 662,595

[22] Filed: Jun. 13, 1996

[51] Int. Cl.$^6$ ............... B32B 15/01; C23C 16/00
[52] U.S. Cl. ............ 428/610; 427/250; 427/255.7; 427/405; 427/576; 427/585; 428/655; 428/665; 428/936
[58] Field of Search ............... 428/610, 665, 428/655, 548, 569, 936; 427/585, 576, 255.7, 250, 405

[56] References Cited

U.S. PATENT DOCUMENTS

| | | | |
|---|---|---|---|
| 3,145,529 | 8/1964 | Maloof | 60/35.6 |
| 3,467,588 | 9/1969 | Gebler et al. | 204/181 |
| 4,917,968 | 4/1990 | Tuffias et al. | 428/621 |
| 5,362,523 | 11/1994 | Gorynin et al. | 427/446 |

OTHER PUBLICATIONS

J. Teraki, T. Hirano, K. Wakashima, An Elastic–Plastic Analysis of Thermal Stresses in a FGM Plate Under Cyclic Thermal Load, Ceramic Transactions, vol. 34, 1990, pp. 67–74.

Y. Sohda, Y. Kude, S. Uemura, T. Saitoh, Y. Wakamatsu and M. Niino, Carbon/Carbon Composites Coated With SiC/C Functionally Gradient Materials, Ceramic Transactions, vol. 34, 1990–1992, pp. 125–132.

R. L. Williamson and B. H. Rabin, Numerical Modeling of Residual Stress in Ni–Al2O3, Ceramic Transactions, vol. 34, 1992, pp. 55–65.

*Primary Examiner*—Paul J. Thibodeau
*Assistant Examiner*—Holly C. Rickman
*Attorney, Agent, or Firm*—Charles D. Brown; Wanda K. Denson-Low

[57] ABSTRACT

A rocket engine component is formed as a tungsten-copper composite substrate, and a functionally-gradient material coating overlying and contacting the substrate. The functionally-gradient material coating has a composition that varies nonlinearly through a thickness of the coating so as to minimize thermal stresses through the coating, and such that the functionally-gradient material coating is tungsten adjacent to the substrate and is rhenium remote from the substrate. In a preferred form, the functionally-gradient material coating includes a tungsten sublayer overlying and contacting the substrate, a tungsten-rhenium sublayer overlying and contacting the tungsten sublayer; and a rhenium sublayer overlying and contacting the tungsten-rhenium sublayer. The functionally-gradient material coating is preferably applied by a low-temperature deposition technique such as plasma enhanced chemical vapor deposition.

20 Claims, 3 Drawing Sheets

TUNGSTEN-COPPER COMPOSITE MATERIAL WITH RHENIUM PROTECTIVE LAYER, AND ITS PREPARATION

BACKGROUND OF THE INVENTION

This invention relates to the coating of a tungsten-copper composite material with a rhenium protective layer, and, more particularly, to the preparation of propulsion and space components from this material.

A liquid-fuel rocket engine typically includes a combustion chamber wherein fuel and oxidizer are combined and burned, and an expansion nozzle through which the resulting hot combustion gases are expanded to produce thrust. The combustion gas is at a high temperature in the combustion chamber and as it passes through the expansion nozzle. Care must therefore be taken that the walls of the combustion chamber and the expansion nozzle do not melt. In large liquid-fuel rocket engines used as the main propulsion engine, the combustion chamber and expansion nozzle may be cooled with a liquid flow, which requires the complexity of a liquid-distribution system. Smaller rocket engines, such as those used in station-keeping, auxiliary, or low-thrust propulsion roles, typically do not use liquid cooling in order to save weight. Cooling of the components of such rocket engines must be accomplished by passive techniques, while at the same time the components must withstand the forces and temperatures experienced during service.

In one approach, part or all of the combustion chamber and expansion nozzle are made of a tungsten-copper composite material, which has a good combination of mechanical properties and thermal conductivity to conduct heat through the walls of the structure. The composite material is typically made by sintering or chemical vapor deposition techniques. In the composite material, the tungsten provides elevated-temperature strength, but, by itself, would have low ductility, toughness, and thermal shock resistance, and also relatively low thermal conductivity. The copper in the composite material improves the ductility and toughness of the composite, and also provides thermal conductivity. Various ratios of tungsten and copper may be employed to achieve strength, ductility, and thermal conductivity properties tailored to specific rocket-engine applications.

Although the presence of copper in the composite material improves its ductility and thence its fracture toughness, it is desirable to even further increase the fracture toughness and resistance to thermal shock. In one approach known in the art, the surface of the tungsten-copper composite is coated with a thin layer of rhenium, which improves the ductility and toughness of the composite material. Because rhenium is a refractory metal with a high melting point, most processes for depositing a thin rhenium layer require high operating and substrate temperatures. However, copper melts at about 1080° C., so the tungsten-copper substrate cannot be heated above this temperature during the deposition of rhenium, or copper melts and flows over the surface of the composite material, resulting in poor bonding, or is even vaporized and lost from the composite material. Experience has shown that most lower-temperature rhenium deposition techniques produce poor bonding between the rhenium and the copper of the tungsten-copper composite material. The result of poor bonding is a reduction of the thermal diffusivity of the rocket-engine component, or even delamination and failure at the rhenium/composite bond line. A number of low-temperature deposition techniques have been tried in an attempt to produce the desired rhenium/composite structure, but these have been largely unsuccessful due to adverse effects on the tungsten-copper composite substrate, poor bonding, or a need to use dangerous chemicals during deposition.

There is a need for an improved approach for providing a rhenium-coated tungsten-copper composite material. The present invention fulfills this need, and further provides related advantages.

SUMMARY OF THE INVENTION

The present invention provides an article made of rhenium-coated tungsten-copper composite material, and a method for preparing such an article. The rhenium is strongly bonded to the composite material, without inducing cracking of the composite material. The composite material is not degraded by the deposition technique, nor are noxious chemicals required in the fabrication operation.

In accordance with the invention, an article of manufacture comprises a tungsten-copper composite substrate, and a functionally-gradient material (FGM) coating overlying and contacting the substrate. The substrate is preferably a component of a rocket engine, such as a combustion chamber or a nozzle. The graded-composition coating has a composition that varies through a thickness of the coating so as to minimize thermal stresses through the coating. The FGM coating has a composition, preferably tungsten, that is adherent to the tungsten-copper substrate adjacent to the substrate and is rhenium remote from the substrate.

Most preferably, the FGM coating comprises a tungsten sublayer overlying and contacting the substrate, a tungsten-rhenium sublayer overlying and contacting the tungsten sublayer, and a rhenium sublayer overlying and contacting the tungsten-rhenium sublayer. The FGM composition may instead include a continuously or semi-continuously nonlinearly varying composition that changes from the adherent composition adjacent to the substrate to rhenium remote from the substrate.

The invention further extends to a method for preparing an article of manufacture comprising providing a tungsten-copper composite substrate, and depositing a functionally-gradient material coating as described previously overlying and contacting the substrate. The deposition of the FGM coating is preferably accomplished by plasma-assisted chemical vapor deposition from appropriate precursor chemicals, which permits deposition with a substrate temperature on the order of 250° C.–850° C.

The present approach provides for articles, such as rocket-engine components and other structures used at elevated temperatures, having a rhenium-coated tungsten-copper composite structure, while maintaining the integrity of the underlying composite material. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 5A–C are three graphs of tungsten content as a function of distance in a functionally-gradient material coating, wherein FIG. 5A depicts coating wherein composition is a continuously varying function, FIG. 5B depicts a coating wherein there is a single intermediate tungsten-rhenium layer, and FIG. 5C depicts a coating wherein there are multiple tungsten-rhenium layers.

DETAILED DESCRIPTION OF THE INVENTION

Figure 1:
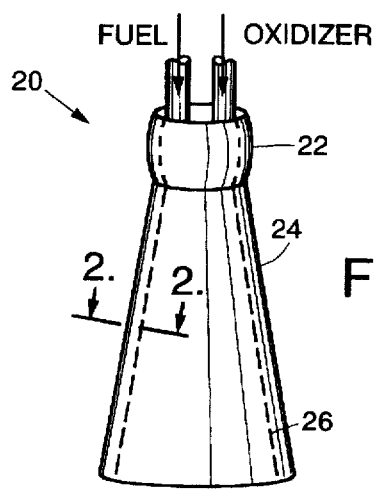
FIG. 1 is a perspective view of a rocket engine combustion chamber and expansion nozzle, with the interior shown in broken lines.

FIG. 1 depicts an article 20, in this case a component of a rocket engine, made according to the invention. The rocket engine article 20 includes a combustion chamber 22 and an integral expansion nozzle 24, each made as a shell 26 of a rhenium-coated tungsten-copper composite material. The design details of the shape of the article 20 are known in the art.

Figure 2:
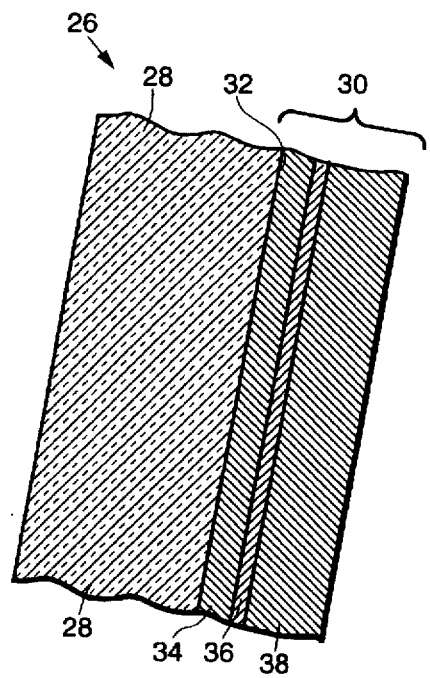
FIG. 2 is an enlarged, schematic sectional view of a portion of the expansion nozzle, taken along line 2—2 of FIG. 1.
Figure 3:
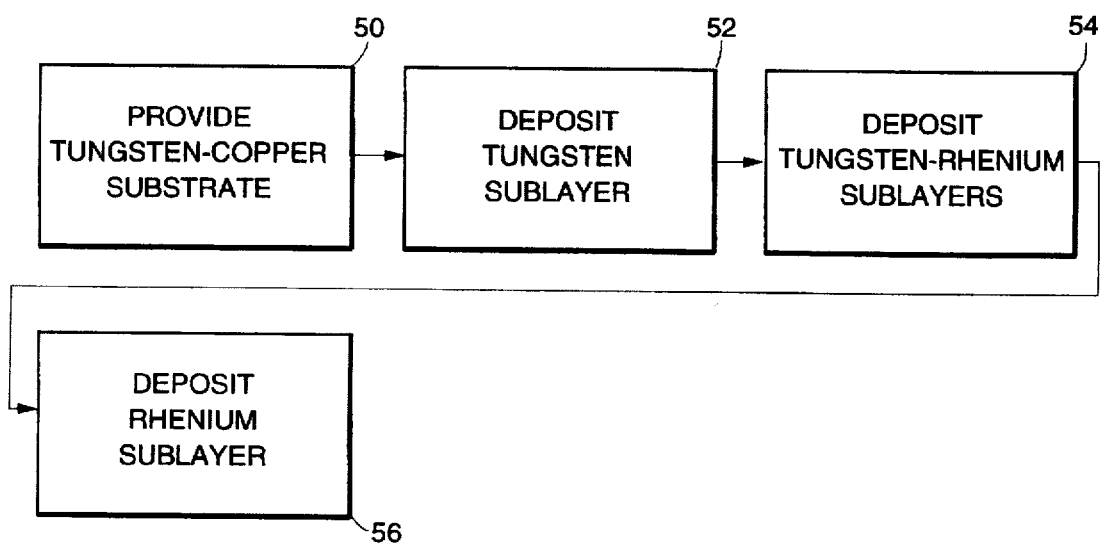
FIG. 3 is a block flow diagram of an approach for preparing an article according to the invention.

FIG. 2 is an enlarged section through the shell 26, and FIG. 3 depicts a preferred method for fabricating the article 20. A substrate 28 of a tungsten-copper composite material is furnished, numeral 50. The substrate 28 is made according to procedures known in the art. Briefly, tungsten powder is pulverized to remove any lumps and, optionally, mixed with sufficient binder to permit formation of a shaped green powder compact. The tungsten powder is cold compacted either uniaxially or hydrostatically to the shape of the object to be fabricated, in this case the shell 26 having the shape of the combustion chamber and nozzle. The compacted powder mixture is solid-state sintered at a temperature sufficient to achieve a theoretical density of about 90 percent. The sintering temperature is typically from about 1600° C. to about 2100° C. About 10 percent liquid copper is thereafter infiltrated into the porous tungsten compact to produce a fully dense tungsten-copper composite material after cooling to ambient temperature.

A functionally-gradient material (FGM) coating 30 is deposited onto the inwardly facing (toward the hot combustion gas of the rocket engine) side 32 of the substrate 28. Deposition is preferably accomplished by plasma enhanced chemical vapor deposition (PECVD). The FGM coating 30 has a composition that is adherent to the tungsten-copper substrate 28 adjacent to the substrate 28 and is rhenium remote from the substrate 28. The preferred composition adjacent to the substrate 28 is tungsten, which adheres well to the tungsten-copper substrate and does not introduce a new material into the system. The coating 30 may have a continuously and nonlinearly varying composition with the adherent material adjacent to the substrate 28. The deposition procedure to be discussed subsequently allows such a continuously varying composition. More preferably, the composition of the coating includes a tungsten sublayer 34 deposited overlying and contacting the substrate 28, numeral 52, one or more tungsten-rhenium sublayers 36 deposited overlying and contacting the tungsten sublayer 34, numeral 54, and a rhenium sublayer 38 deposited overlying and contacting the tungsten-rhenium sublayer 36, numeral 56. (Iridium or other operable metals may be used instead of tungsten, but most alternatives to tungsten are expensive.) The tungsten sublayer 34 preferably has a thickness of from about 0.0008 to about 0.004 inches. The tungsten-rhenium sublayer 36 preferably has a thickness of from about 0.0002 to about 0.008 inches, and preferably has a composition comprising from about 10 to about 20 weight percent rhenium, balance tungsten. The rhenium sublayer 38 has a thickness of from about 0.002 to about 0.025 inches. (In FIG. 2, the thicknesses of the layers are not drawn to scale.)

The tungsten sublayer 34 adheres well to the tungsten-copper composite substrate 28. However, rhenium does not adhere well directly to either tungsten or tungsten-copper composite material. The tungsten-rhenium sublayer 36, being intermediate in composition between tungsten and rhenium, bonds well to the tungsten sublayer 34 and also to the rhenium sublayer 38. Thus, by using the functionally-gradient coating 30, the rhenium is adhered to the substrate using the intermediate layers to promote the adhesion and bonding.

A functionally-gradient material forms the coating 30. A functionally-gradient material differs from a conventional gradient material or coating in that the conventional gradient material has a generally linear variation in composition with distance, while the functionally-gradient material has a composition that varies nonlinearly with distance. The nonlinear variation in composition is selected responsive to the nonlinear variation in thermal stress with distance outwardly from the substrate 28 into the coating 30, which in turn is due to the geometry of the structure and the materials properties of the materials which make up the coating. In the preferred case here, the coating is made of tungsten and rhenium, tungsten because it adheres well to the tungsten-copper composite material and rhenium because it is the desired exposed surface of the article. Additionally, the coating may optionally contain intentionally placed porosity.

The functional form of the curve of composition as a function of distance in the coating, between the end constraints, is determined by any operable method. A finite element approach is preferred, as such an approach can most readily take into account the specific geometry and the materials properties. Finite element techniques for determining thermal strains and stresses in a functionally-gradient structure as a function of distance from the surface of the substrate are known in the art. Such techniques are described, for example, in publications presented in Ceramic Transactions, Vol. 34, published by the American Ceramic Society, Westerville, Ohio. Three examples are R. L. Williamson et al., "Numerical Modeling of Residual Stress in Ni—$Al_2O_3$ Gradient Materials", pages 55–65; J. Teraki et al., "An Elastic-Plastic Analysis of Thermal Stresses in a FGM Plate Under Cyclic Thermal Load", pages 67–74; and Y. Sohda et al., "Carbon/Carbon Composites Coated with SiC/C Functionally-gradient Materials", pages 125–132. Briefly, the thermal conductivity, modulus, Poisson ratio, heat capacity, coefficient of thermal expansion, and yield stress of the substrate and the components in the coating are supplied to the finite-element thermal model of the substrate and coating, with the composition varying through the thickness of the coating. The external thermal loadings are also supplied, such as maximum temperature, and external temperature as a function of time and position. The finite element model optimizes the composition in the coating as a function of distance according to some criteria, preferably minimization of the maximum stress experienced in the coating. The nature of the finite element model varies according to the geometry of the article and coating, but the principles discussed herein are applied in each case.

Figure 4:
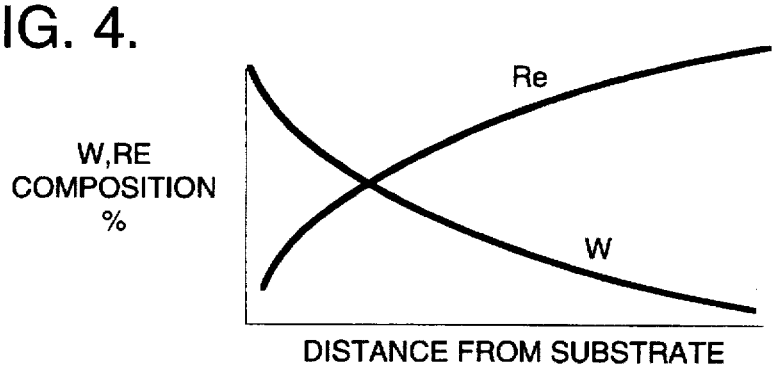
FIG. 4 is a graph of tungsten and rhenium content as a function of distance in a functionally-gradient material coating.

FIG. 4 illustrates the composition of a coating 30 as a function of distance from the surface of the substrate, for tungsten and rhenium constituents in a hypothetical situation wherein the optimizing criterion is achieving a minimum largest stress within the coating. The total of the tungsten and rhenium contents is 100 weight percent, and the composition as a function of distance is nonlinear.

Figure 5A:
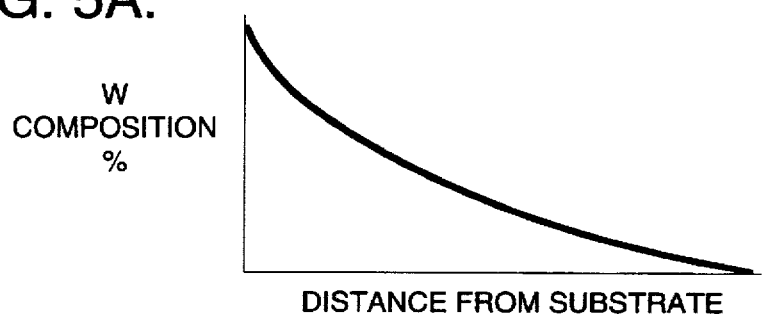

FIG. 5A illustrates the composition as a function of distance in a coating, corresponding to the calculation of FIG. 4. FIG. 5A repeats the tungsten percentage of FIG. 4 (the rhenium being 100 minus the tungsten percentage). FIG. 5A thus depicts a continuously varying tungsten content as a function of distance, one embodiment of the invention.

Figure 5B:
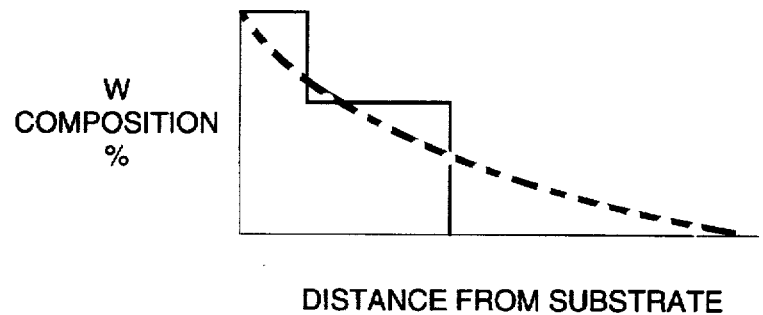
Figure 5C:
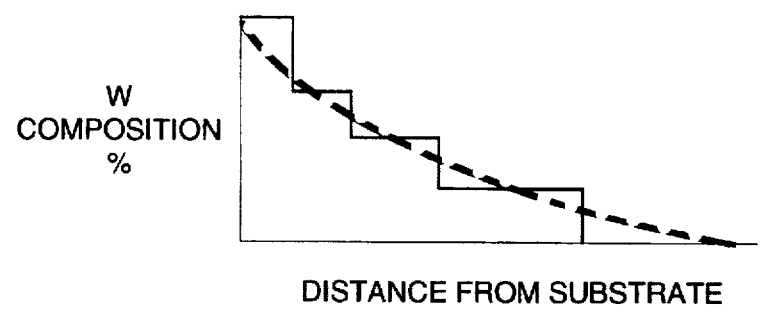

In most cases using available coating deposition apparatus, it is neither possible nor necessary to achieve a smoothly and continuously varying composition profile in the coating to match that of FIG. 4. Instead, the coating is prepared in a series of stepped compositions, two types of which are shown in FIGS. 5B and 5C. In FIG. 5B, the coating is tungsten adjacent to the substrate to achieve good bonding with the tungsten-copper substrate and rhenium far from the substrate at the surface of the coating. There is a single step in composition, in this case a step wherein the tungsten content is about 80–90 weight percent tungsten. This step is selected to approximately but not exactly match the shape of the curve of FIG. 4. The continuously varying composition curve of FIG. 4 may be even more-closely matched with a plurality of intermediate compositional steps, as shown in FIG. 5C. In the discussion herein, a single step as in FIG. 5B will be used as exemplary, but it is understood that the invention is applicable to the forms of composition variation of FIGS. 5A and 5C as well.

In an actual case determined for a cylindrical tungsten copper substrate, the single-step configuration of FIG. 5B was determined. A layer of 20–100 micrometers of tungsten was adjacent to the substrate. A layer of 50–100 micrometers of an alloy of 80–90 weight percent tungsten, 10–20 weight percent rhenium overlaid the tungsten layer. A layer of 100–200 micrometers of rhenium overlaid the tungsten-rhenium layer.

Figure 6:
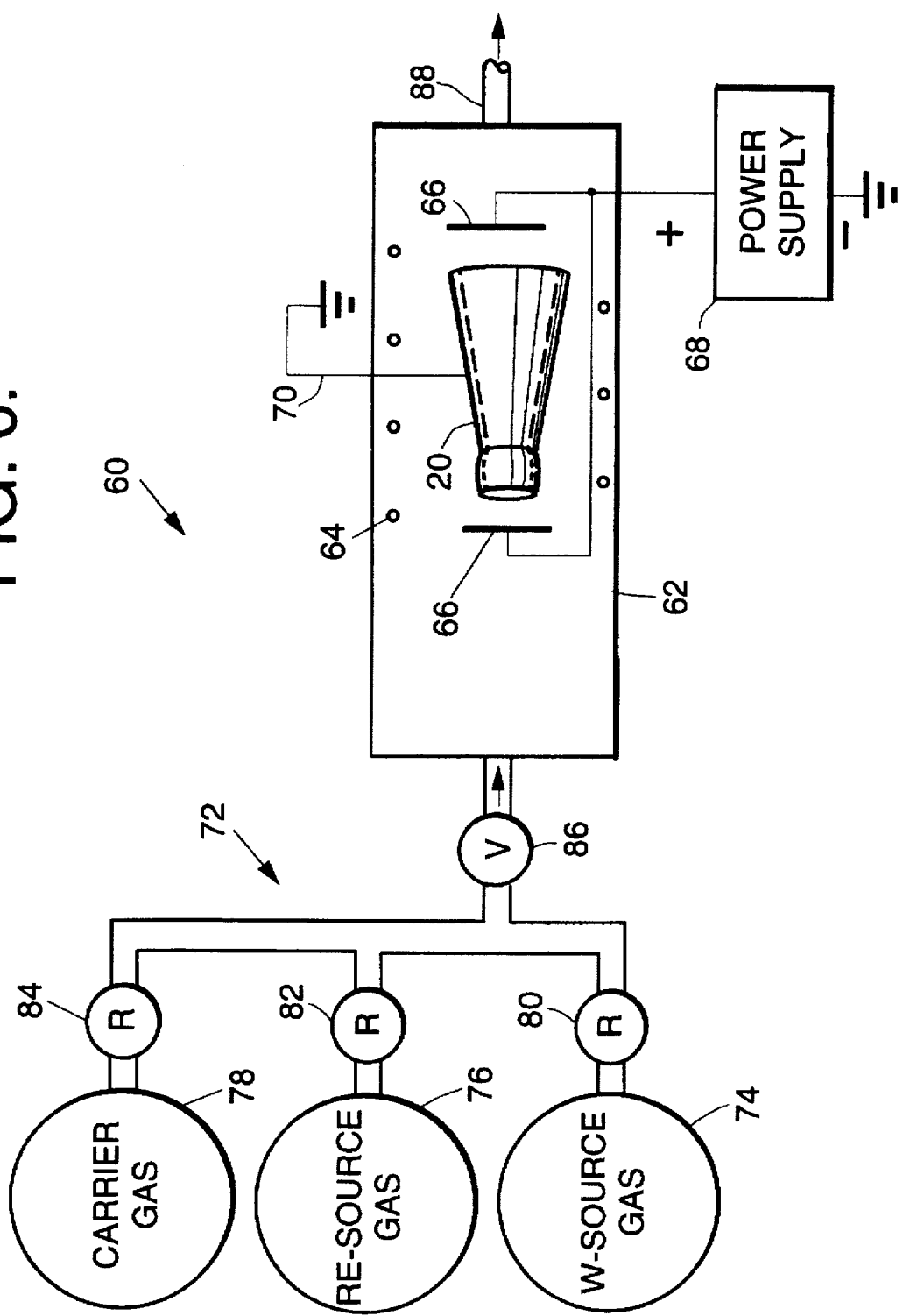
FIG. 6 is a schematic view of an apparatus for performing the coating operation.

The sublayers 34, 36, and 38 are applied by an approach which permits forming the gradient composition but without heating the tungsten-copper substrate 28 to a temperature such that it overly oxidizes, melts, or evaporates from the sintered structure. The preferred deposition approach utilizes plasma-enhanced chemical vapor deposition, which operates at a lower temperature than conventional chemical vapor deposition techniques. An apparatus 60 for such deposition is illustrated in FIG. 6.

The apparatus 60 includes a deposition chamber 62 sufficiently large to receive the article 20 to be processed. The article 20 is heated by an induction coupled plasma heating system, indicated by the induction heating coils 64. (Those portions of the article 20 which are not to receive the FGM coating 30 deposited thereon are masked.) Plasma formation plates 66 are positioned adjacent to the article 20 and are connected to the positive side of a power supply 68. The article 20 is electrically grounded, numeral 70.

A flow of gas is supplied to the chamber 62 by a gas delivery system 72. The gas delivery system 72 includes a source of a tungsten-source precursor gas 74, a source of a rhenium-source precursor gas 76, and a source of a carrier gas 78. The precursor gases are gases that, upon decomposition, deposit the selected metallic ion upon the substrate. The preferred tungsten-source precursor gas is tungsten fluoride, and the preferred rhenium-source precursor gas is rhenium fluoride. The carrier gas is preferably an inert gas, most preferably argon.

The sources 74, 76, and 78 each have a respective pressure/flow regulator 80, 82, and 84 to control the relative flow rates of the three gases. There is a master flow valve 86 controlling the total flow rate of the gas mixture. The pressure/flow regulators 80, 82, and 84, and the master flow valve 86 may be set by hand, as would typically be the case in the preferred approach involving the deposition of distinct sublayers. Initially, the rhenium-source regulator 82 is set to zero and the tungsten-source regulator 80 is set to pass a flow of tungsten-source precursor gas, so that the first sublayer 34 to be deposited contains only tungsten. The rhenium-source regulator 82 is thereafter opened so that there is a flow of both tungsten-source precursor gas and rhenium-source precursor gas, and the second sublayer 36 contains both rhenium and tungsten. Later, the tungsten-source regulator 80 is closed and the rhenium-source regulator 82 remains open, so that the third sublayer 38 contains only rhenium. The carrier gas regulator 84 remains open during the entire deposition procedure. The pressure/flow regulators 80, 82, and 84, and the master flow valve 86 may alternatively be controlled by a process controller such as a microprocessor if a continuously varying gradient-composition coating is to be deposited. The residual gas containing unreacted precursor gases, reaction products, and carrier gas is removed from the chamber 62, numeral 88, and delivered to a gas-cleanup system (not shown).

In operation, the article 20 is heated by the induction coupled plasma to a suitable temperature, preferably from about 250° C. to about 650° C. The plates 66 are energized so as to create a plasma adjacent to the surface of the article 20. The flow of precursor source gas(es) and carrier gas from the gas delivery system 72 enters the chamber, and ionized and decomposed in the plasma. The tungsten and rhenium deposit upon the substrate 28 to form the sublayers 34, 36, or 38, depending upon the composition of the gas flow at that time. The deposition times required to achieve the necessary thicknesses of the respective sublayers, under particular combinations of partial pressures and deposition temperature, are determined by straightforward calibration procedures undertaken in preliminary trials.

The present invention has been reduced to practice using the previously described approach with a simulated rocket-engine nozzle in the form of a hollow tungsten-copper composite cylinder having an outside diameter of 1 inch, an inside diameter of 0.5 inch, and a length of 1 inch. The FGM coated cylinder was tested by thermal cycling from 300° C. to 1500° C. and back to 300° C., with each such cycle requiring one hour. After about 25 cycles, the cylinder and coating were examined and found to have no cracks in the coating and no loss of integrity or adhesion of the coating.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An article of manufacture, comprising:
   a tungsten-copper composite substrate; and
   a functionally-gradient material coating overlying and contacting the substrate, the functionally-gradient material coating having a composition that varies through a thickness of the coating responsive to a determination of the thermal deformation state of the coating, and such that the functionally-gradient material coating is tungsten it adjacent to the substrate and is rhenium remote from the substrate.

2. The article of claim 1, wherein the functionally-gradient material coating has a continuously varying composition from tungsten to rhenium.

3. The article of claim 1, wherein the functionally-gradient material coating comprises:

a tungsten sublayer overlying and contacting the substrate, at least one tungsten-rhenium sublayer overlying and contacting the tungsten sublayer, and a rhenium sublayer overlying and contacting the tungsten-rhenium sublayer.

4. The article of claim 3, wherein the at least one tungsten-rhenium sublayer comprises a plurality of tungsten-rhenium sublayers of varying compositions.

5. The article of claim 3, wherein the tungsten sublayer has a thickness of from about 0.0008 to about 0.004 inches.

6. The article of claim 3, wherein the at least one tungsten-rhenium sublayer has a thickness of from about 0.0002 to about 0.008 inches.

7. The article of claim 3, wherein the at least one tungsten-rhenium sublayer has a composition comprising from about 10 to about 20 weight percent rhenium, balance tungsten.

8. The article of claim 3, wherein the rhenium sublayer has a thickness of from about 0.002 to about 0.025 inches.

9. The article of claim 1, wherein the substrate is a component of a rocket engine.

10. An article of manufacture, comprising:

a tungsten-copper composite substrate; and a functionally-gradient material coating overlying and contacting the substrate, the functionally-gradient material coating having a composition that varies through a thickness of the coating so as to minimize thermal stresses through the coating, and such that the functionally-gradient material coating is tungsten adjacent to the coating and is rhenium remote from the substrate.

11. The article of claim 10, wherein the functionally-gradient material coating has a continuously varying composition from tungsten to rhenium.

12. The article of claim 10, wherein the functionally-gradient material coating comprises:

a tungsten sublayer overlying and contacting the substrate, at least one tungsten-rhenium sublayer overlying and contacting the tungsten sublayer, and a rhenium sublayer overlying and contacting the tungsten-rhenium sublayer.

13. The article of claim 10, wherein the substrate is a component of a rocket engine.

14. A method for preparing an article of manufacture, comprising: providing a tungsten-copper composite substrate; and depositing a functionally-gradient material coating overlying and contacting the substrate, the functionally-gradient material coating having a composition that varies through a thickness of the coating so as to minimize thermal stresses through the coating, and such the functionally-gradient material coating has a composition that is adherent to the tungsten-copper substrate adjacent to the substrate and is rhenium remote from the substrate.

15. The method of claim 14, wherein the step of providing a tungsten-copper composite substrate includes the step of providing a substrate which is a component of a rocket engine.

16. The method of claim 14, wherein the step of depositing a functionally-gradient material coating includes the step of depositing at least a portion of the functionally-gradient material coating by plasma enhanced chemical vapor deposition.

17. The method of claim 14, wherein the step of depositing a functionally-gradient material coating includes the steps of depositing a tungsten sublayer overlying and contacting the substrate, depositing at least one tungsten-rhenium sublayer overlying and contacting the tungsten sublayer; and depositing a rhenium sublayer overlying and contacting the at least one tungsten-rhenium sublayer.

18. An article of manufacture, comprising:

a tungsten-copper composite substrate; and a functionally-gradient material coating overlying and contacting the substrate, the functionally-gradient material coating having a composition that varies non-linearly through a thickness of the coating such that the functionally-gradient material coating is tungsten adjacent to the substrate and is rhenium remote from the substrate.

19. The article of claim 18, wherein the functionally-gradient material coating has a continuously varying composition from tungsten to rhenium.

20. The article of claim 18, wherein the functionally-gradient material coating comprises:

a tungsten sublayer overlying and contacting the substrate, at least one tungsten-rhenium sublayer overlying and contacting the tungsten sublayer, and a rhenium sublayer overlying and contacting the tungsten-rhenium sublayer.

* * * * *